(12) United States Patent
Moon et al.

(10) Patent No.: US 11,404,519 B2
(45) Date of Patent: Aug. 2, 2022

(54) ORGANIC LIGHT EMITTING DISPLAY DEVICE

(71) Applicant: Samsung Display Co., LTD., Yongin-si (KR)

(72) Inventors: Ji Ho Moon, Hwaseong-si (KR); Jong Woo Park, Seongnam-si (KR); Dae Youn Cho, Yongin-si (KR); Young Tae Choi, Cheonan-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 123 days.

(21) Appl. No.: 17/034,852

(22) Filed: Sep. 28, 2020

(65) Prior Publication Data

US 2021/0134918 A1 May 6, 2021

(30) Foreign Application Priority Data

Nov. 6, 2019 (KR) .................. 10-2019-0140931

(51) Int. Cl.
*H01L 27/32* (2006.01)
*H01L 27/12* (2006.01)
*H01L 27/02* (2006.01)
*H01L 51/52* (2006.01)

(52) U.S. Cl.
CPC ...... *H01L 27/3272* (2013.01); *H01L 27/3246* (2013.01); *H01L 27/3262* (2013.01); *H01L 27/3265* (2013.01); *H01L 27/3276* (2013.01)

(58) Field of Classification Search
CPC ............. H01L 27/3272; H01L 27/3262; H01L 27/3265; H01L 27/3276; H01L 27/3246
See application file for complete search history.

(56) References Cited

U.S. PATENT DOCUMENTS

| 2007/0228411 | A1* | 10/2007 | Lee | ................ G02F 1/13624 |
| | | | | 257/147 |
| 2016/0055792 | A1* | 2/2016 | Lee | ................ G09G 3/3233 |
| | | | | 315/173 |
| 2016/0217733 | A1* | 7/2016 | Kim | ................ H01L 27/3276 |
| 2016/0233281 | A1* | 8/2016 | Yoon | ................ H01L 27/124 |

(Continued)

FOREIGN PATENT DOCUMENTS

| KR | 10-1066964 | 9/2011 |
| KR | 10-2017-0019547 | 2/2017 |
| KR | 10-2018-0025354 | 3/2018 |

*Primary Examiner* — Mohsen Ahmadi
(74) *Attorney, Agent, or Firm* — Kile Park Reed & Houtteman PLLC

(57) ABSTRACT

An organic light emitting display device may include a first active pattern disposed on a substrate and including a first region, a second region, and a third region; a first gate electrode disposed on the first active pattern and forming a first transistor together with the first region and the second region; a second gate electrode disposed on the first active pattern and forming a second transistor together with the second region and the third region; a third gate electrode disposed on the first gate electrode, overlapping the second region, and forming a storage capacitor together with the first gate electrode; a metal pattern disposed between the first active pattern and the third gate electrode and overlapping the second region; and an organic light emitting diode electrically connected to the first transistor, the second transistor, and the storage capacitor.

20 Claims, 14 Drawing Sheets

(56) References Cited

U.S. PATENT DOCUMENTS

| | | | | |
|---|---|---|---|---|
| 2017/0005156 A1* | 1/2017 | Kim | .................... | H01L 27/3258 |
| 2017/0117343 A1* | 4/2017 | Oh | ...................... | H01L 27/3276 |
| 2017/0365649 A1* | 12/2017 | Kim | .................... | H01L 27/3246 |
| 2018/0033849 A1* | 2/2018 | Noh | .................... | H01L 27/1222 |
| 2019/0027546 A1* | 1/2019 | Lee | .................... | H01L 27/3258 |
| 2019/0341431 A1* | 11/2019 | Lee | .................... | H01L 27/3262 |
| 2020/0052056 A1* | 2/2020 | Park | .................... | H01L 27/1259 |
| 2020/0144349 A1* | 5/2020 | Lee | .................... | H01L 27/3216 |

\* cited by examiner

ORGANIC LIGHT EMITTING DISPLAY DEVICE

CROSS-REFERENCE TO RELATED APPLICATION(S)

This application claims priority to Korean Patent Application No. 10-2019-0140931 under 35 U.S.C. § 119, filed in the Korean Intellectual Property Office (KIPO) on Nov. 6, 2019, the contents of which are incorporated herein in its entirety by reference.

BACKGROUND

1. Technical Field

The present disclosure relates generally to an organic light emitting display device, and more specifically, to an organic light emitting display device including a metal pattern.

2. Description of the Related Art

Recently, an organic light emitting display device has attracted attention as a display device. In general, the organic light emitting display device may include a plurality of pixel circuits, and each of the pixel circuits may include transistors, at least one storage capacitor, and an organic light emitting diode. The transistors may include a first transistor for generating a driving current and supplying the driving current to the organic light emitting diode and a second transistor for transferring a data voltage to the first transistor in response to a scan signal. The pixel circuit may be driven by turning on or turning off the transistors, respectively, during each of an emission period and a non-emission period.

In case that the pixel circuit is driven, a threshold voltage of the second transistor may be altered as a temperature inside the pixel circuit increases. Accordingly, in case that the scan signal for turning off the second transistor is provided to the second transistor, a leakage current passing through the second transistor may be generated. For example, a data voltage (e.g., a black data voltage corresponding to a black image) provided to the second transistor may be provided to the first transistor during a non-emission period in which the second transistor is turned off. The data voltage may interfere with an operation of generating a driving current by the first transistor, so that undesired horizontal lines may be displayed on the conventional organic light emitting display device.

It is to be understood that this background section is, in part, intended to provide useful background for understanding the technology. However, this background section may also include ideas, concepts, or recognitions that were not part of what was known or appreciated by those of ordinary skill in the pertinent art prior to a corresponding effective filing date of the subject matter disclosed herein.

SUMMARY

Some embodiments of the invention provide an organic light emitting display device including a metal pattern.

According to an aspect of an embodiment, an organic light emitting display device may include a first active pattern disposed on a substrate and including a first region, a second region, and a third region; a first gate electrode disposed on the first active pattern, overlapping a portion of the first active pattern, and forming a first transistor together with the first region and the second region; a second gate electrode disposed on the first active pattern and forming a second transistor together with the second region and the third region, wherein the first and second gate electrodes are disposed on a same layer; a third gate electrode disposed on the first gate electrode, overlapping the second region, and forming a storage capacitor together with the first gate electrode; a metal pattern disposed between the first active pattern and the third gate electrode and overlapping the second region; and an organic light emitting diode electrically connected to the first transistor, the second transistor, and the storage capacitor.

In an embodiment, the metal pattern may shield the second region so that no parasitic capacitor is generated between the second region and the third gate electrode.

In an embodiment, the first transistor may include a driving transistor, and a data voltage may be provided to the second region.

In an embodiment, the metal pattern may be disposed along a planar shape of the second region.

In an embodiment, the metal pattern may be spaced apart from the first and second gate electrodes.

In an embodiment, no voltage may be provided to the metal pattern.

In an embodiment, the metal pattern and the first and second gate electrodes may be disposed on the same layer.

In an embodiment, the first, second, and third regions may not overlap the first and second gate electrodes. The second region may be disposed between the first region and the third region. A data voltage may be provided to the second region through the second transistor, and the data voltage provided to the second region may be provided to the first transistor.

In an embodiment, the first and second transistors may be PMOS transistors.

In an embodiment, the first active pattern may include a silicon semiconductor.

In an embodiment, ions may be injected into the first, second, and third regions.

In an embodiment, the organic light emitting display device may further include a first gate insulating layer disposed on the substrate and covering the first active pattern, a second gate insulating layer disposed on the first gate insulating layer and covering the first and second gate electrodes, and a first interlayer insulating layer disposed on the second gate insulating layer and covering the third gate electrode.

In an embodiment, the organic light emitting display device may further include a second active pattern disposed on the first interlayer insulating layer and including a fourth region, a fifth region, and a sixth region; a second interlayer insulating layer disposed on the first interlayer insulating layer and covering the second active pattern; a fourth gate electrode disposed on the second interlayer insulating layer, overlapping a portion of the second active pattern, and forming a third transistor together with the fourth region and the fifth region; and a fifth gate electrode disposed on the second interlayer insulating layer, overlapping a portion of the second active pattern, and forming a fourth transistor together with the fifth region and the sixth region.

In an embodiment, the metal pattern may overlap a portion of the fourth gate electrode.

In an embodiment, the metal pattern may not overlap the second active pattern and the fifth gate electrode.

In an embodiment, the second active pattern may not overlap the first active pattern.

In an embodiment, the first active pattern may include a silicon semiconductor, and the second active pattern may include an oxide semiconductor.

In an embodiment, the first and second transistors may be PMOS transistors, and the third and fourth transistors may be NMOS transistors.

In an embodiment, the first active pattern may further include a seventh region, an eighth region, and a ninth region. The organic light emitting display device may further include a sixth gate electrode disposed on the first active pattern, overlapping a portion of the first active pattern, and forming a fifth transistor together with the second region and the seventh region, a seventh gate electrode disposed on the first active pattern, overlapping a portion of the first active pattern, and forming a sixth transistor together with the first region and the eighth region, and an eighth gate electrode disposed on the first active pattern, overlapping a portion of the first active pattern, and forming a seventh transistor together with the eighth region and the ninth region. The first, second, sixth, seventh, and eighth electrodes may be disposed on the same layer.

In an embodiment, the sixth gate electrode and the seventh gate electrode may be electrically connected to each other.

The organic light emitting display device may include the metal pattern, so that generation of a parasitic capacitor between the third gate electrode and the second region is suppressed. Since the metal pattern suppresses generation of the parasitic capacitor, the metal pattern may facilitate maintaining a voltage level of the first gate electrode and may allow the first transistor to stably generate a driving current. Accordingly, undesired horizontal lines may not be displayed on the organic light emitting display device.

Another advantage of the invention is that the organic light emitting display device may not be required to maintain a high voltage of a scan signal applied at a high voltage level to suppress generation of leakage current of the second transistor. Accordingly, a power consumption of the organic light emitting display device may be reduced, and a voltage margin of the scan signal may be secured.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
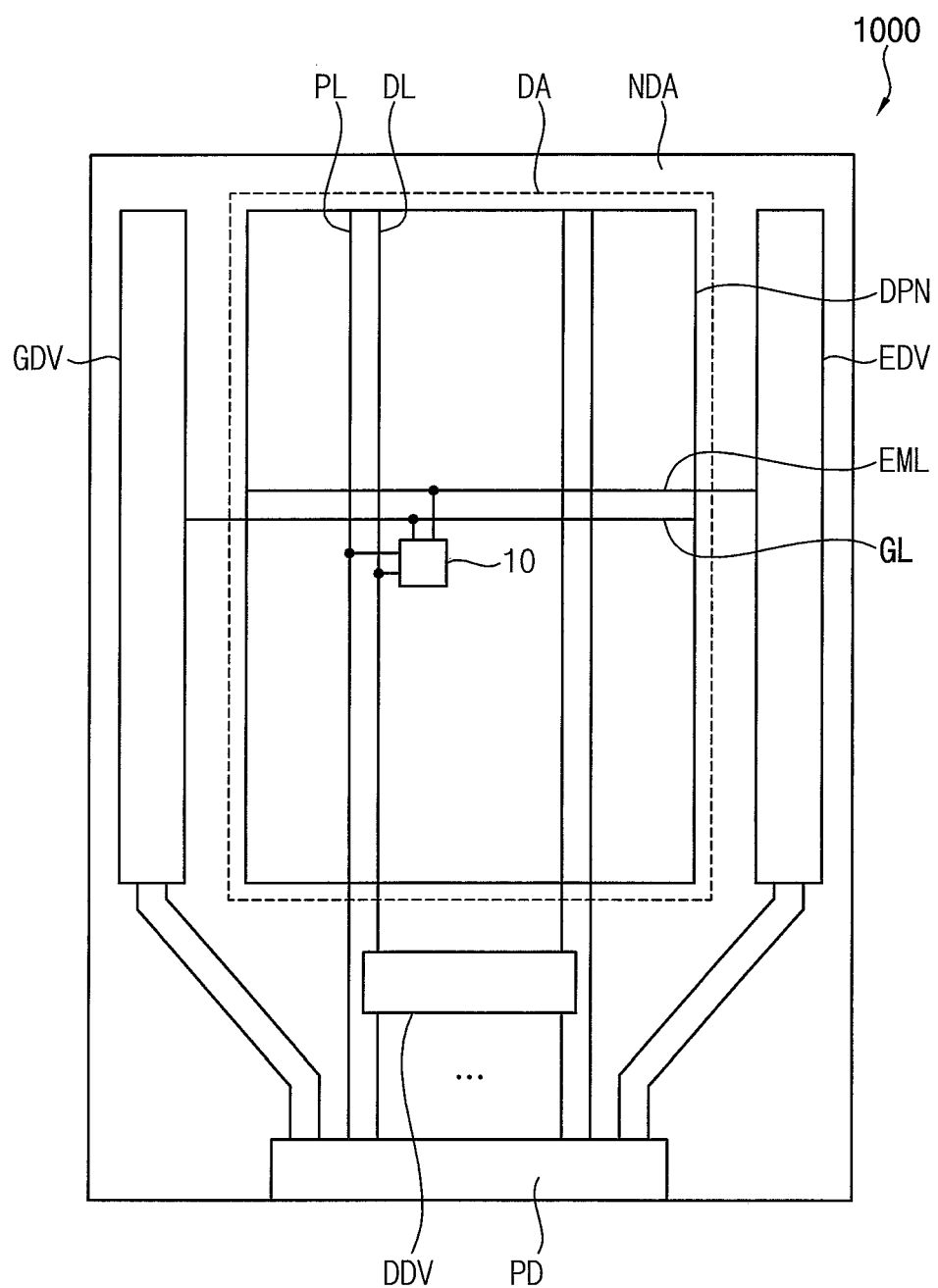
FIG. 1 is a plan view illustrating an organic light emitting display device according to an example embodiment.

Embodiments of the invention will be described hereinafter with reference to the accompanying drawings.

Although the invention may be modified in various manners and have additional embodiments, embodiments are illustrated in the accompanying drawings and will be described in the specification. However, the scope of the invention is not limited to the embodiments in the accompanying drawings and the specification and should be construed as including all the changes, equivalents and substitutions included in the spirit and scope of the invention.

In the drawings, sizes and thicknesses of elements may be enlarged for clarity and ease of description thereof. However, the invention is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Further, "over" or "on" may include positioning on or below an object and does not necessarily imply a direction based upon gravity.

The term "overlap" as used herein may include layer, stack, face or facing, extending over, covering or partly covering or any other suitable term as would be appreciated and understood by those of ordinary skill in the art. The term "do not overlap" as used herein may include "apart from" or "set aside from" or "offset from" and any other suitable equivalents as would be appreciated and understood by those of ordinary skill in the art.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes," and/or "including" are used in this specification, they or it may specify the presence of stated features, integers, steps, operations, elements and/or components, but does not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first region" is discussed in the description, it may also be termed "a second region" or "a third region" in the claims, and "a second region" and "a third region" may be termed in a similar manner without departing from the teachings herein.

Unless otherwise defined, all terms used herein (including technical and scientific terms) have the same meaning as commonly understood by those of ordinary skill in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
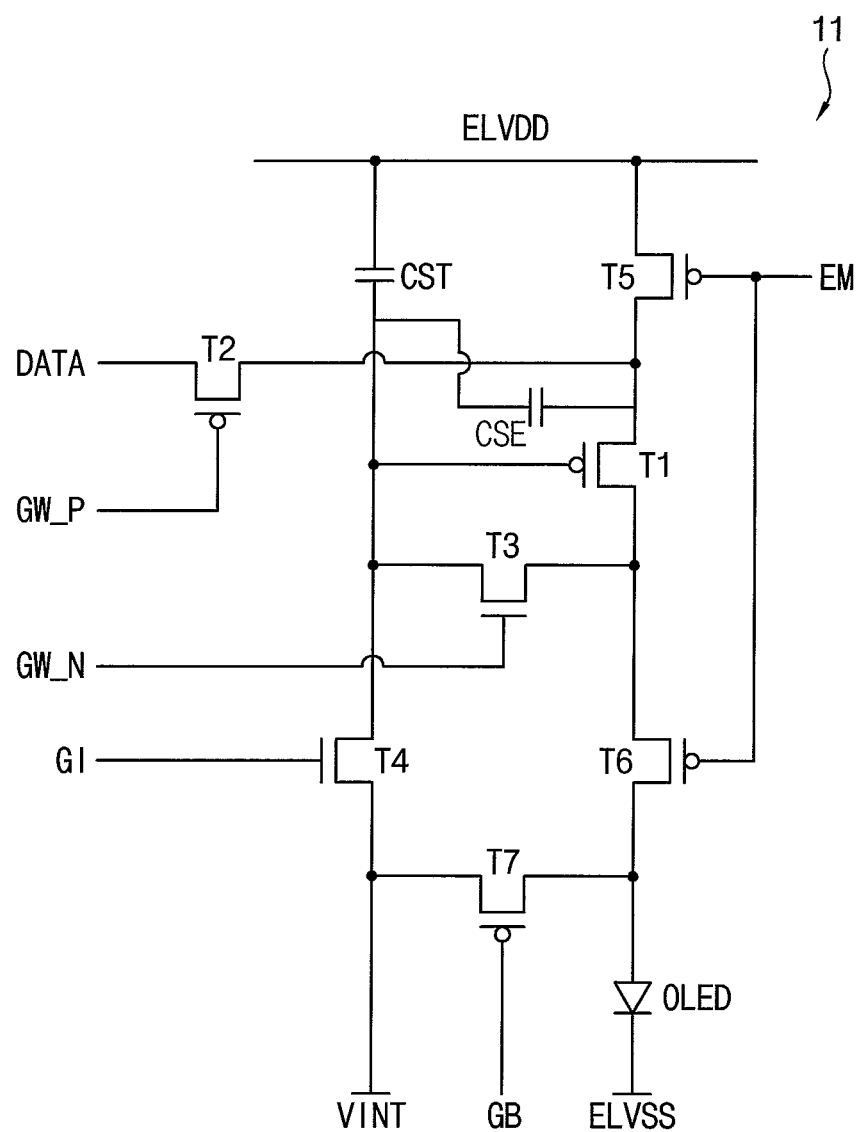
FIG. 2 is a schematic circuit diagram illustrating a pixel circuit included in the organic light emitting display device of FIG. 1.
Figure 3:
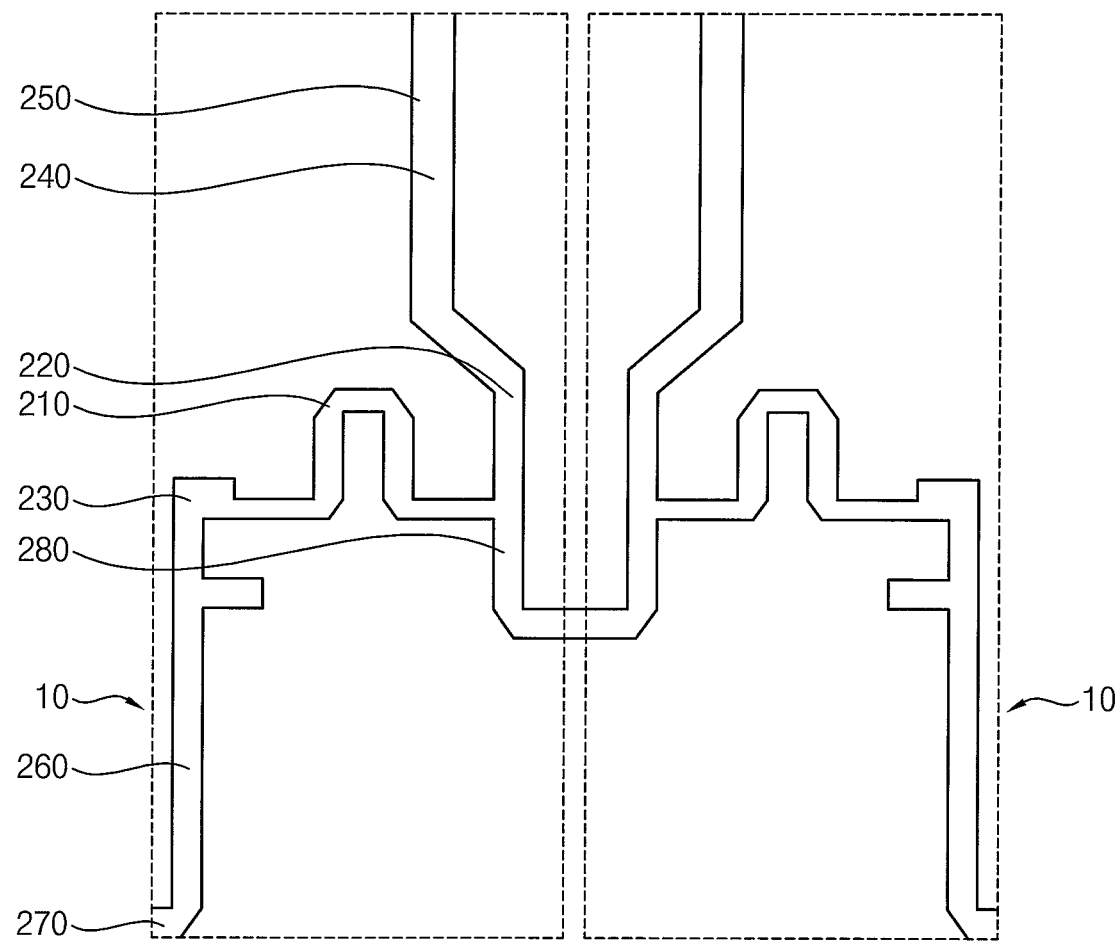
FIGS. 3 to 8 are schematic layout diagrams illustrating the organic light emitting display device of FIG. 1.
Figure 3:
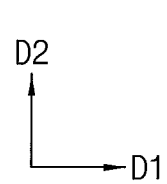
Figure 4:
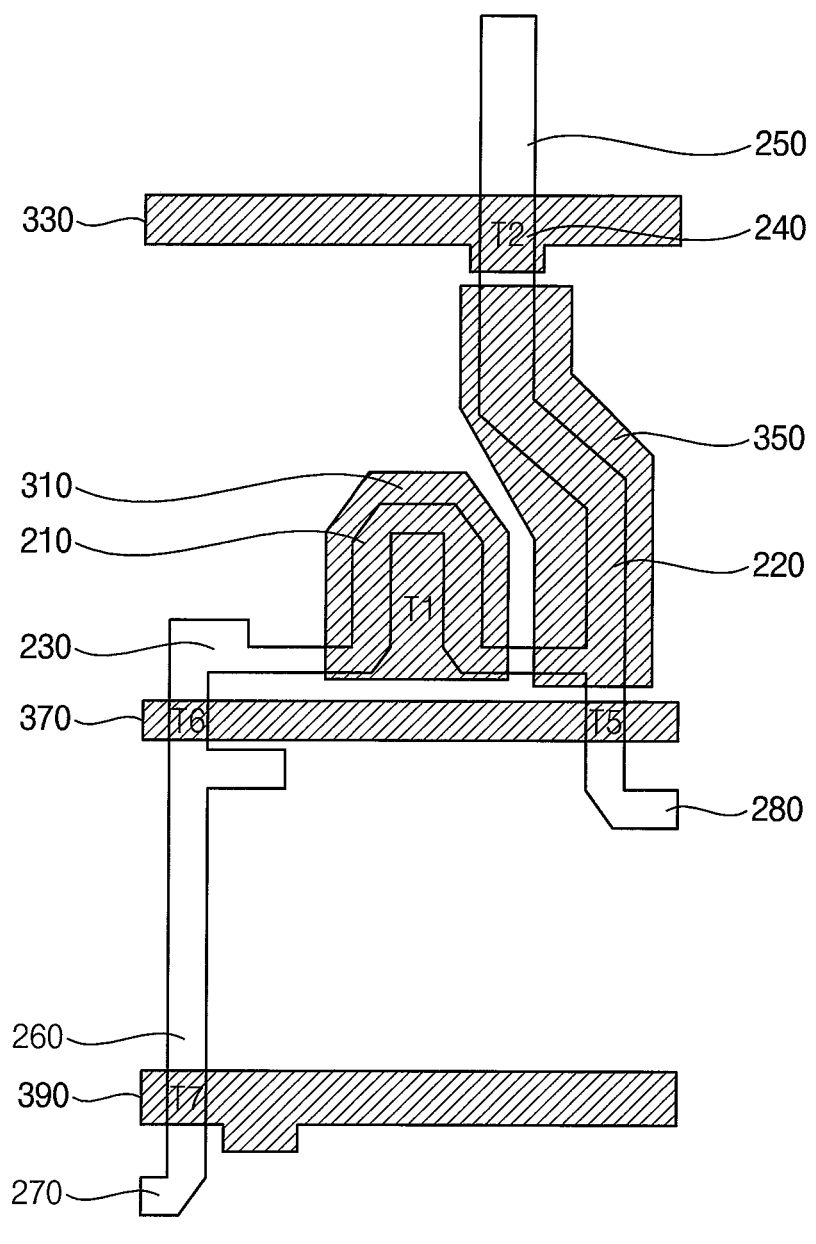
Figure 5:
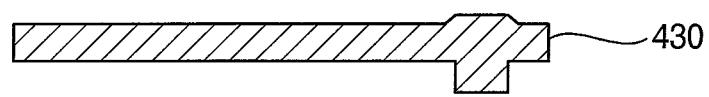
Figure 5:
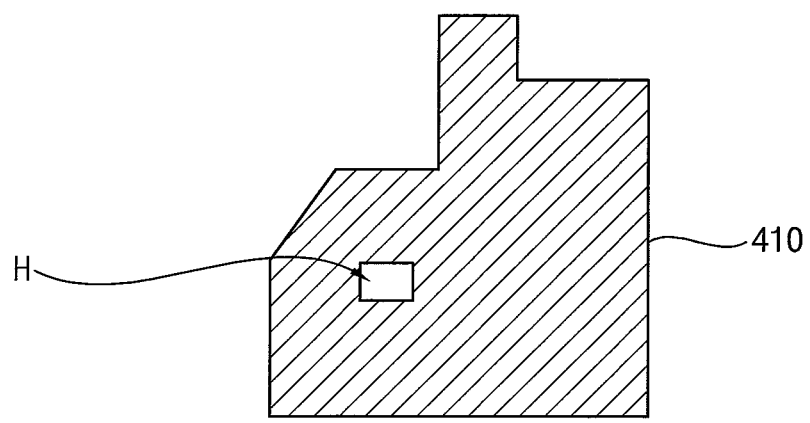
Figure 5:
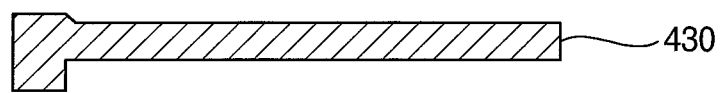
Figure 5:
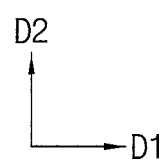
Figure 6:
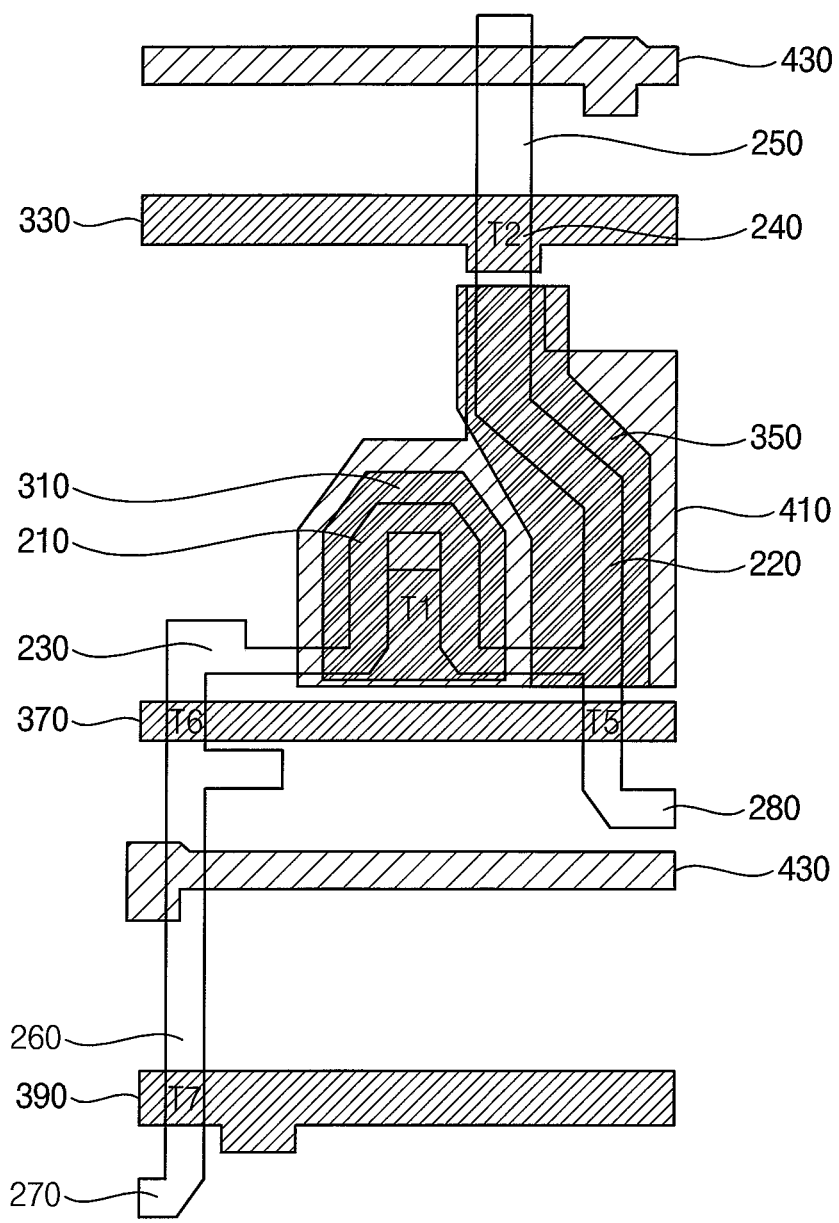
Figure 7:
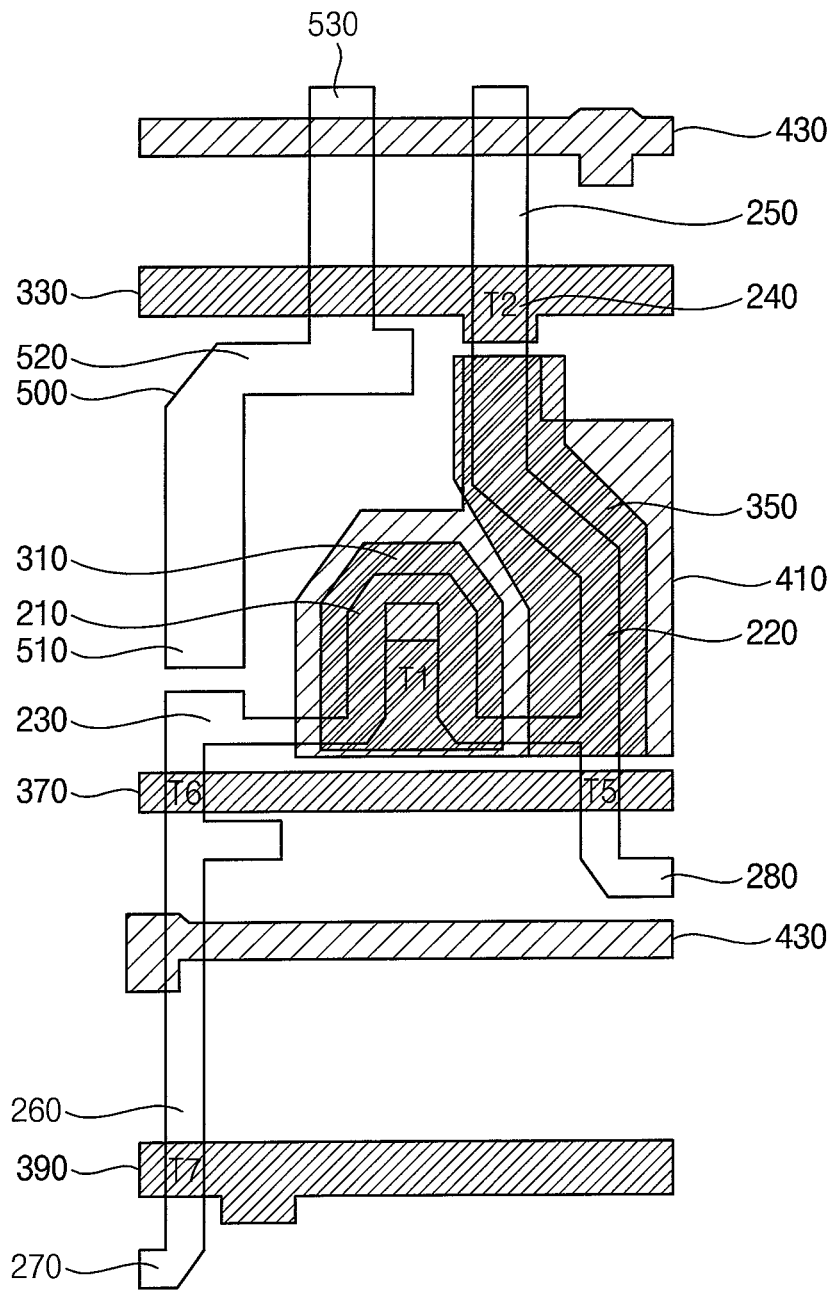

FIG. 1 is a plan view illustrating an organic light emitting display device according to an embodiment. FIG. 2 is a schematic circuit diagram illustrating a pixel circuit included in the organic light emitting display device of FIG. 1.

Referring to FIGS. 1 and 2, the organic light emitting display device 1000 may include a display panel DPN disposed in a display area DA and a panel driver disposed in a non-display area NDA.

The display panel DPN may include a pixel structure 10, a data line DL, a gate line GL, an emission control line EML, a driving voltage line PL, and an initialization voltage line. The data line DL, the gate line GL, the emission control line EML, the driving voltage line PL, and the initialization voltage line may be connected to the pixel structure 10. The gate line GL may include a first scan line, a second scan line, an initialization control line, and a bypass line. The pixel structure 10 may generate a light as a pixel circuit 11 is driven.

The data line DL may be connected to a data driver DDV and may extend along a second direction D2. The data line DL may transfer a data voltage DATA from the data driver DDV to the pixel circuit 11. The data driver DDV may generate the data voltage DATA corresponding to each emission period and/or each non-emission period and may provide the data voltage DATA to the pixel circuit 11.

The gate line GL may be connected to a gate driver GDV and may extend along a first direction D1 crossing the second direction D2. The gate line GL may transfer a scan signal from the gate driver GDV to the pixel circuit 11.

The emission control line EML may be connected to an emission controller EDV and may extend along the first direction D1 in parallel with the gate line GL. The emission control line EML may transfer an emission control signal EM from the emission controller EDV to the pixel circuit 11. The emission period of the pixel structure 10 may be an active period of the emission control signal EM and the non-emission period of the pixel structure 10 may be an inactive period of the emission control signal EM.

The driving voltage line PL may be connected to a pad part PD and may extend along the second direction D2 in parallel with the data line DL. The driving voltage line PL may transfer a high-power voltage ELVDD from the pad part PD to the pixel circuit 11. A low-power voltage ELVSS may be commonly provided to an opposite electrode (e.g., a cathode electrode) of an organic light emitting diode OLED.

The panel driver may include the gate driver GDV, the data driver DDV, the emission controller EDV, and the pad part PD. The panel driver may include a timing controller, and the timing controller may control the gate driver GDV, the data driver DDV, and the emission controller EDV.

The gate driver GDV may generate the scan signal by using a voltage provided through the pad part PD. The scan signal may include a first voltage to turn off a transistor and a second voltage to turn on the transistor and may be provided to the pixel circuit 11 passing through the gate line GL. The scan signal may include a first scan signal GW_P, a second scan signal GW_N, an initialization control signal GI, and a bypass signal GB. In an embodiment, the gate driver GDV may provide the initialization control signal GI and the bypass signal GB to the pixel circuit 11 passing through the initialization control line and the bypass line, respectively.

Although FIG. 1 illustrates that the gate driver GDV and the emission controller EDV are respectively disposed on a left side and a right side of the organic light emitting display device 1000, but the invention is not limited thereto. In an embodiment, two gate drivers GDV and two emission controllers EDV may be disposed on the left side and the right side of the organic light emitting display device 1000, respectively. In another embodiment, the emission controller EDV may be omitted.

Although FIG. 1 illustrates that the data driver DDV is mounted in the non-display area NDA of the organic light emitting display device 1000, the invention is not limited thereto. For example, the data driver DDV may be disposed on a separate flexible printed circuit board, and the pad part PD may be electrically connected to the flexible printed circuit board.

The pixel circuit 11 may include the organic light emitting diode OLED, a first transistor T1 (e.g., a driving transistor), a second transistor T2, a third transistor T3, a fourth transistor T4, a fifth transistor T5, a sixth transistor T6, a seventh transistor T7, and a storage capacitor CST.

The organic light emitting diode OLED may include a first terminal (e.g., an anode terminal) and a second terminal (e.g., a cathode terminal), the first terminal of the organic light emitting diode OLED may be connected to the first transistor T1 through the sixth transistor T6 so that the first terminal is provided with a driving current, and the second terminal may be provided with the low-power voltage ELVSS. The organic light emitting diode OLED may generate a light having a luminance corresponding to the driving current.

The storage capacitor CST may include a first terminal and a second terminal. The first terminal of the storage capacitor CST may be connected to the first transistor T1 and the second terminal of the storage capacitor CST may be provided with the high-power voltage ELVDD. The storage capacitor CST may maintain a voltage level of a gate terminal of the first transistor T1 during an inactive period of the scan signal GW_P. Therefore, the first transistor T1 may stably generate the driving current.

The first transistor T1 may include a gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 so that the data voltage DATA is provided to the first transistor T1. The second terminal of the first transistor T1 may be connected to the organic light emitting diode OLED through the sixth transistor T6 so that the first transistor T1 provides the driving current. The first transistor T1 may generate the driving current based on a voltage difference between the gate terminal and the first terminal.

A parasitic capacitor CSE may be generated between the first terminal of the storage capacitor CST and the first terminal of the first transistor T1 because of the data voltage DATA (e.g., a black data voltage corresponding to a black image) provided to the first terminal of the first transistor T1. Accordingly, a voltage level of a capacitance generated between the first terminal of the storage capacitor CST and the gate terminal of the first transistor T1 (or a voltage level of a capacitance stored in the storage capacitor CST) may become unstable. Accordingly, the gate terminal of the first transistor T1 may not maintain the voltage level stably during the inactive period of the first scan signal GW_P (particularly, during the non-emission period of the pixel structure 10 of the inactive period of the first scan signal GW_P). Therefore, the first transistor T1 may not stably generate the driving current, and undesired horizontal lines may be displayed on a conventional organic light emitting display device.

However, an organic light emitting display device 1000 according to embodiments of the invention described below may suppress generation of the parasitic capacitor CSE. Therefore, the organic light emitting display device 1000 may stably maintain the voltage level of the capacitance generated between the first terminal of the storage capacitor CST and the gate terminal of the first transistor T1. Accordingly, the storage capacitor CST may maintain the voltage level of the gate terminal of the first transistor T1.

The second transistor T2 may include a gate terminal, a first terminal (e.g., a source terminal), and a second terminal (e.g., a drain terminal). The gate terminal of the second transistor T2 may be provided with the first scan signal GW_P passing through the gate line GL.

The second transistor T2 may be turned on or off in response to the first scan signal GW_P. For example, in case that the second transistor T2 is a PMOS transistor, the second transistor T2 may be turned off in case that the first scan signal GW_P has a positive voltage level and may be turned on in case that the first scan signal GW_P has a negative voltage level. The first terminal of the second transistor T2 may be provided with the data voltage DATA passing through the data line DL. The second terminal of the second transistor T2 may provide the data voltage DATA to the first terminal of the first transistor T1 while the second transistor T2 is turned on.

The third transistor T3 may be turned on or off in response to the second scan signal GW_N. For example, in case that the third transistor T3 is an NMOS transistor, the third transistor T3 may be turned on in case that the second scan signal GW_N has a positive voltage level, and may be turned off in case that the second scan signal GW_N has a negative voltage level.

During a period in which the third transistor T3 is turned on in response to the second scan signal GW_N, the third transistor T3 may connect the gate terminal of the first transistor T1 with the second terminal of the first transistor T2 (i.e., a diode connection of the first transistor T1). Since the first transistor T1 is diode-connected, a voltage difference equal to a threshold voltage of the first transistor T1 may result between the gate terminal of the first transistor T1 and the first terminal of the first transistor T1. Accordingly, a voltage equal to a sum of the data voltage DATA provided to the first terminal of the first transistor T1 and the threshold voltage of the first transistor T1 may be provided to the gate terminal of the first transistor T1 while the third transistor T3 is turned on. Therefore, the third transistor T3 may compensate for the threshold voltage of the first transistor T1.

The fourth transistor T4 may include a gate terminal, a first terminal (e.g., a source terminal), and a second terminal (e.g., a drain terminal). The gate terminal of the fourth transistor T4 may be provided with the initialization control signal GI. The first terminal of the fourth transistor T4 may be provided with an initialization voltage VINT. The second terminal of the fourth transistor T4 may be connected to the gate terminal of the first transistor T1.

The fourth transistor T4 may be turned on or off in response to the initialization control signal GI. For example, in case that the fourth transistor T4 is an NMOS transistor, the fourth transistor T4 may be turned on in case that the initialization control signal GI has a positive voltage level, and may be turned off in case that the initialization control signal GI has a negative voltage level.

During a period in which the fourth transistor T4 is turned on in response to the initialization control signal GI, the initialization voltage VINT may be provided to the gate terminal of the first transistor T1. Therefore, the fourth transistor may initialize the gate terminal of the first transistor T1 with the initialization voltage VINT.

The fifth transistor T5 may include a gate terminal, a first terminal (e.g., a source terminal), and a second terminal (e.g., a drain terminal). The gate terminal of the fifth transistor T5 may be provided with the emission control signal EM. The first terminal of the fifth transistor T5 may be provided with the high-power voltage ELVDD. The second terminal of the fifth transistor T5 may be connected to the first terminal of the first transistor T1. In case that the fifth transistor T5 is turned on in response to the emission control signal EM, the fifth transistor T5 may provide the high-power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may be provided with the emission control signal EM. The first terminal of the sixth transistor T6 may be connected to the second terminal of the first transistor T1. The second terminal of the sixth transistor T6 may be connected to the first terminal of the organic light emitting diode OLED. In case that the sixth transistor T6 is turned on in response to the emission control signal EM, the sixth transistor T6 may provide the driving current generated by the first transistor T1 to the organic light emitting diode OLED. Accordingly, the organic light emitting diode OLED may generate a light.

The seventh transistor T7 may include a gate terminal, a first terminal (e.g., a source terminal), and a second terminal (e.g., a drain terminal). The gate terminal of the seventh transistor T7 may be provided with the bypass signal GB. The first terminal of the seventh transistor T7 may be provided with the initialization voltage VINT. The second terminal of the seventh transistor T7 may be connected to the first terminal of the organic light emitting diode OLED. In case that the seventh transistor T7 is turned on in response to the bypass signal GB, the seventh transistor T7 may provide the initialization voltage VINT to the organic light emitting diode OLED. Therefore, the seventh transistor T7 may initialize the organic light emitting diode OLED with the initialization voltage VINT.

It is noted that the connection structure of the pixel circuit 11 illustrated in FIG. 2 is exemplary, and the connection structure may be changed in many ways. For example, in case that the pixel circuit 11 does not include the third to seventh transistors T3, T4, T5, T6, and T7, the connection structure of the pixel circuit 11 may be changed to form a connection structure among elements included in the pixel circuit 11 (e.g., the first transistor T1, the second transistor T2, the storage capacitor CST, and the organic light emitting diode OLED).

Figure 8:
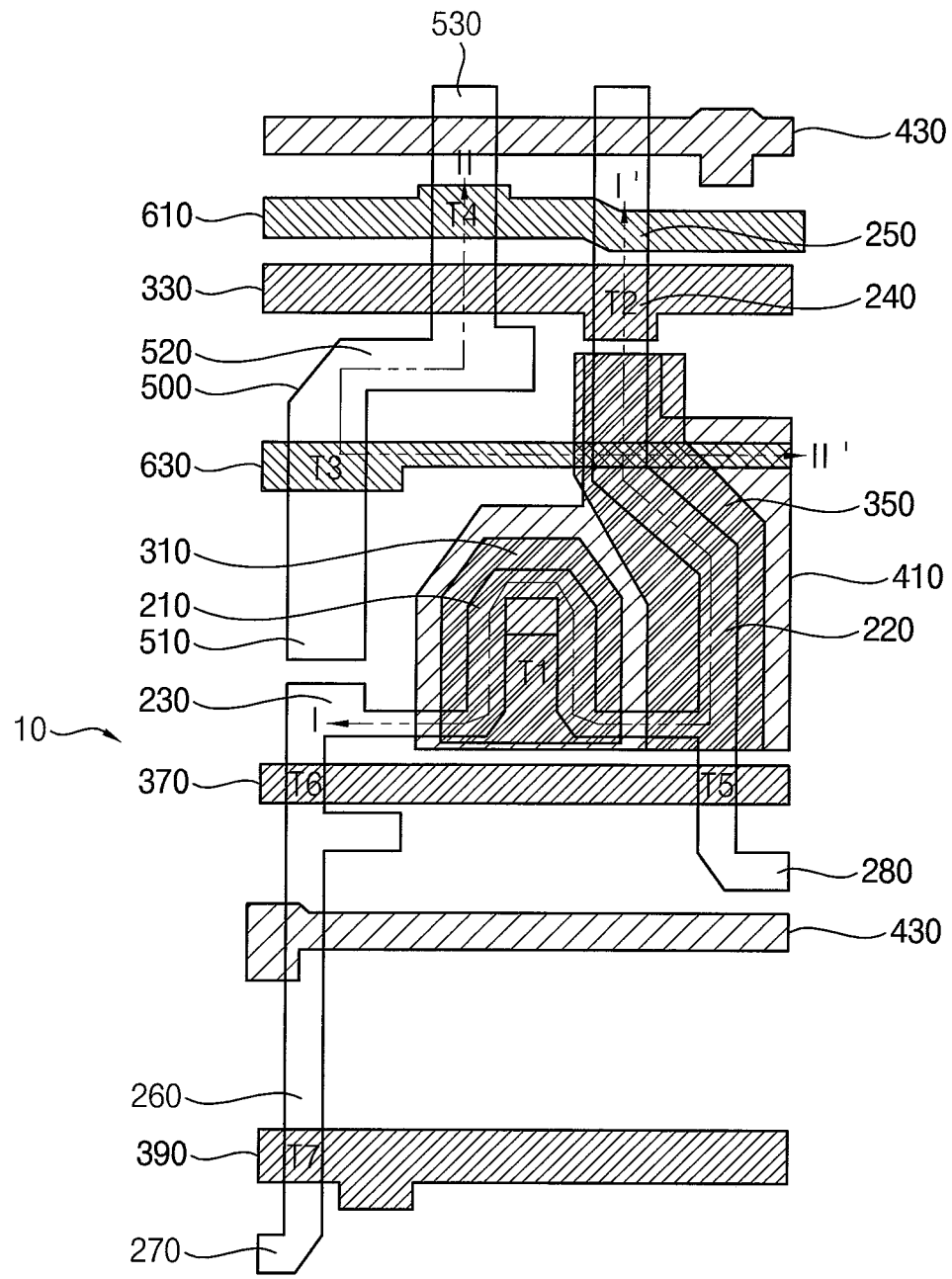
Figure 9:
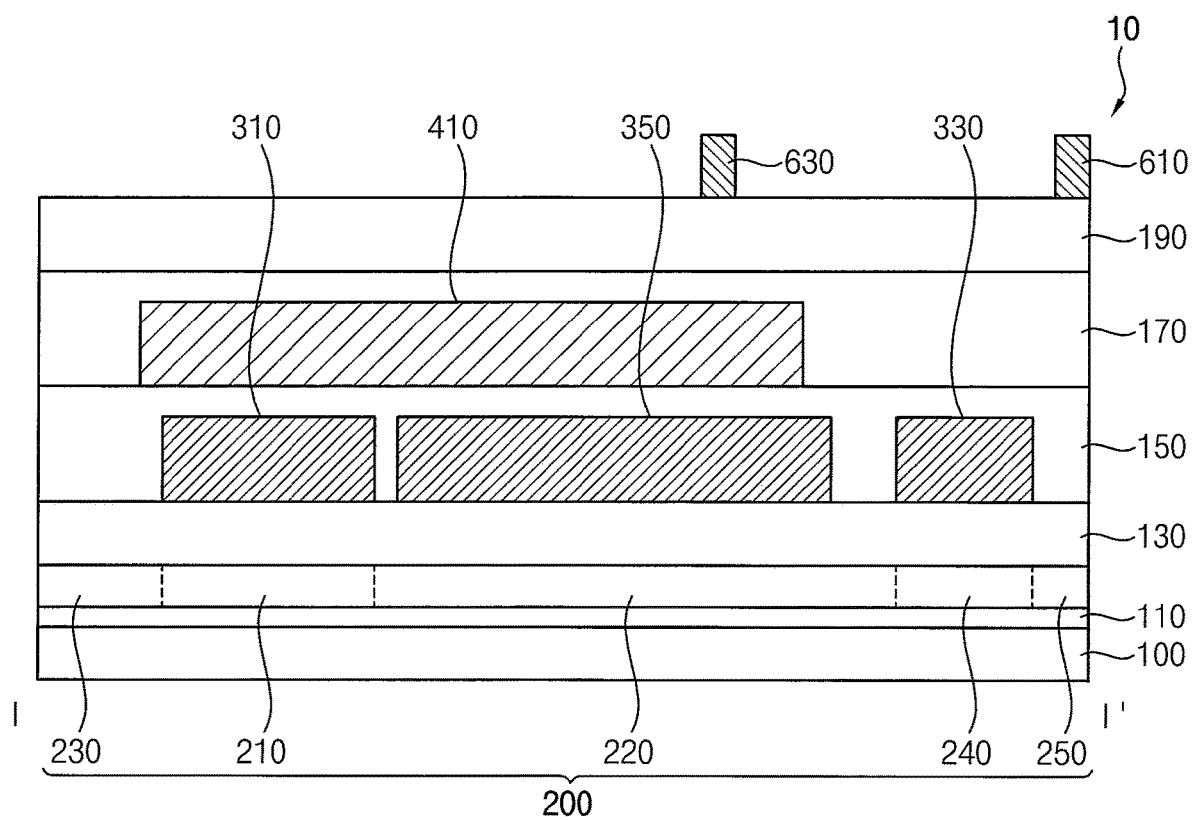
FIG. 9 is a schematic cross-sectional view taken along line I-I' of FIG. 8.
Figure 10:
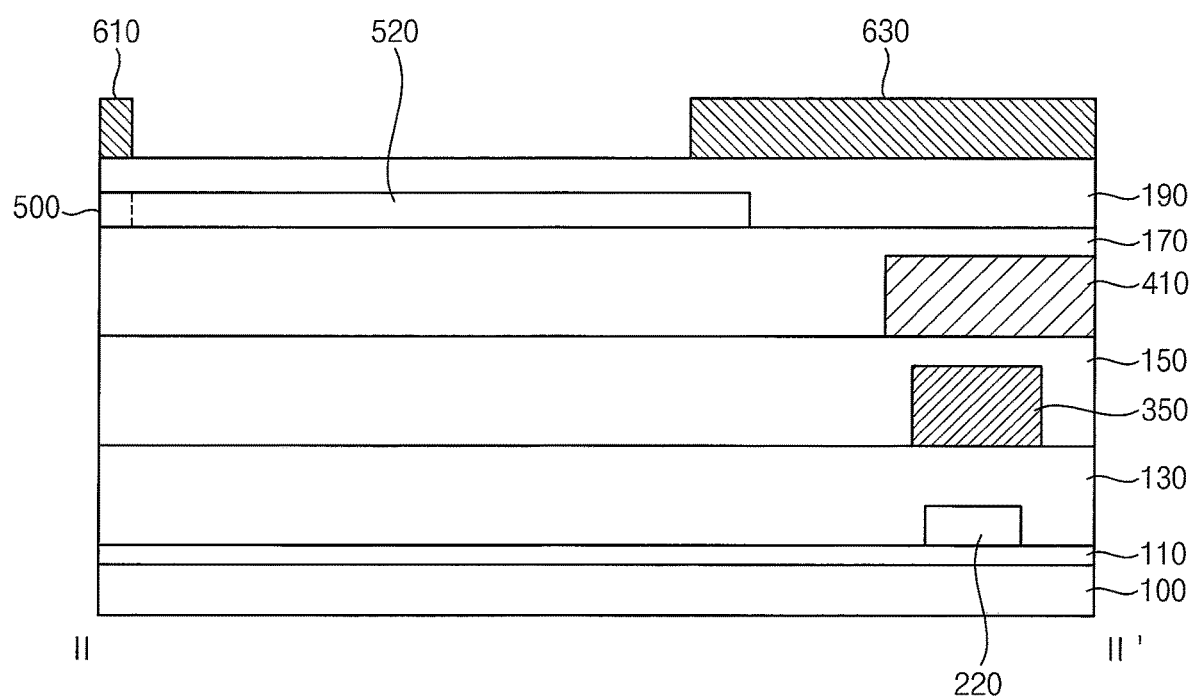
FIG. 10 is a schematic cross-sectional view taken along line II-II' of FIG. 8.

FIGS. 3 to 8 are schematic layout diagrams illustrating the organic light emitting display device of FIG. 1, FIG. 9 is a schematic cross-sectional view taken along line I-I' of FIG. 8, and FIG. 10 is a schematic cross-sectional view taken along line II-II' of FIG. 8.

Referring to FIGS. 1 to 3, and 9, the organic light emitting display device 1000 may include the pixel structure 10 repeatedly disposed along the first direction D1. The pixel structure 10 may include a substrate 100, a buffer layer 110, a first active pattern 200, a first gate insulating layer 130, a first gate electrode 310, a second gate electrode 330, a metal pattern 350, a third gate electrode 370, a fourth gate electrode 390, a second gate insulating layer 150, a fifth gate electrode 410, an initialization voltage line 430, a first interlayer insulating layer 170, a second active pattern 500, a second interlayer insulating layer 190, a sixth gate electrode 630, a seventh gate electrode 610, and the organic light emitting diode OLED (also refer to FIGS. 5 to 8 and 10).

The substrate 100 may include a glass substrate, a quartz substrate, and a plastic substrate. In an embodiment, the substrate 100 may include the plastic substrate so that the organic light emitting display device 1000 is a flexible display device. The substrate 100 may have a structure in which at least one organic film layer and at least one barrier layer are alternately stacked. For example, the organic film layer may be formed using an organic material such as polyimide, and the barrier layer may be formed using an inorganic material.

The buffer layer 110 may be disposed on the substrate 100. The buffer layer 110 may prevent metal atoms or impurities from being diffused from the substrate 100 into the first active pattern 200. The buffer layer 110 may adjust a heat transfer rate during a crystallization process for forming the first active pattern 200 so that the first active pattern 200 may be uniformly formed.

The first active pattern 200 may be disposed on the buffer layer 110. The first active pattern 200 may include a first region 210, a second region 220, a third region 230, a fourth region 240, a fifth region 250, a sixth region 260, a seventh region 270, and an eighth region 280 (also refer to FIGS. 3, 4 and 6-8). In an embodiment, the first active pattern 200 may include a silicon semiconductor. The silicon semiconductor may include an amorphous silicon, a polycrystalline silicon, or the like.

In an embodiment, ions may be injected into the second, third, fifth, sixth, seventh, and eighth regions 220, 230, 250, 260, 270, and 280 of the first active pattern 200. For example, in case that the first and second transistors T1 and T2 are PMOS transistors, ions may be injected into the second, third, and fifth regions 220, 230, and 250. Accordingly, the first region 210 located between the second region 220 and the third region 230 and the fourth region located between the second region 220 and the fifth region 250 may be channel regions.

The first gate insulating layer 130 may be disposed on the substrate 100 and may cover the first active pattern 200. The first gate insulating layer 130 may include an insulating material. For example, the first gate insulating layer 130 may include a silicon oxide, a silicon nitride, a titanium oxide, a tantalum oxide, or the like.

Referring to FIGS. 1, 2, 4, and 9, the first gate electrode 310 may be disposed on the first gate insulating layer 130 and may form (or constitute) the first transistor T1 together with the second region 220 and the third region 230. For example, the first gate electrode 310 may overlap the first region 210 and may not overlap the second and third regions 220 and 230. The first gate electrode 310 may include a metal, an alloy, a conductive metal oxide, a transparent conductive material, or the like.

The first transistor T1 may be substantially same as the first transistor T1 described with reference to FIG. 2. Accordingly, the first gate electrode 310, the second region 220, and the third region 230 may correspond to the gate terminal, the first terminal, and the second terminal of the first transistor T1 described with reference to FIG. 2, respectively.

The second to seventh transistors T2, T3, T4, T5, T6, and T7 described below may be substantially same as the second to seventh transistors T2, T3, T4, T5, T6, and T7 described with reference to FIG. 2, respectively. Accordingly, the gate terminals, the first terminals, and the second terminals described with reference to FIG. 2 may substantially correspond to gate electrodes and regions of active pattern described below. Although the corresponding relationship therebetween is not described in detail below, it would be apparent to a person of ordinary skill in the art.

The second gate electrode 330 and the first gate electrode 310 may be disposed on a same layer. The second gate electrode 330 may form (or constitute) the second transistor T2 together with the second region 220 and the fifth region 250. For example, the second gate electrode 330 may overlap the fourth region 240 and may not overlap the second and fifth regions 220 and 250. The second gate electrode 330 may include a metal, an alloy, a conductive metal oxide, a transparent conductive material, or the like.

The third gate electrode 370 and the first and second gate electrodes 310 and 330 may be disposed on a same layer. A portion of the third gate electrode 370 may overlap the first active pattern 200 so that the portion of the third gate electrode 370 forms (or constitutes) the sixth transistor T6 together with the third region 230 and the sixth region 260. Another portion of the third gate electrode 370 may overlap the first active pattern 200 so that the another portion of the third gate electrode 370 forms (or constitutes) the fifth transistor T5 together with the second region 220 and the eighth region 280. The fourth gate electrode 390 and the first, second, and third gate electrodes 310, 330, and 370 may be disposed on a same layer. The fourth gate electrode 390 may overlap the first active pattern 200 so that the fourth gate electrode 390 forms (or constitutes) the seventh transistor T7 together with the sixth region 260 and the seventh region 270.

The second gate insulating layer 150 may be disposed on the first gate insulating layer 130 and may cover the first, second, third, and fourth gate electrodes 310, 330, 370, and 390. The second gate insulating layer 150 may include the insulating material.

Referring to FIGS. 1, 2, 5, 6, and 9, the fifth gate electrode 410 may be disposed on the second gate insulating layer 150 and may form (or constitute) the storage capacitor CST together with the first gate electrode 310. For example, the fifth gate electrode 410 may include a hole H overlapping the first gate electrode 310. The fifth gate electrode 410 may overlap the second region 220.

The metal pattern 350 may be disposed between the first active pattern 200 and the fifth gate electrode 410 and may overlap the second region 220. In an embodiment, the metal pattern 350 and the first and second gate electrodes 310 and 330 may be disposed on a same layer. The metal pattern 350 may be simultaneously formed of a same material. In another embodiment, the metal pattern 350 may overlap the second region 220 and may be disposed along a planar shape of the second region 220. In still another embodiment, the metal pattern 350 may be disposed in or as an island structure so that the metal pattern 350 does not receive any voltage. For example, the metal pattern 350 may be spaced apart from the first and second gate electrodes 310 and 330.

The first transistor T1 may be provided with the data voltage DATA through the second transistor T2. Specifically, the data voltage DATA may be provided to the first transistor T1 passing through the second region 220 disposed between the second transistor T2 and the first transistor T1.

In case that the pixel circuit 11 is driven, a threshold voltage of the second transistor T2 may change as a temperature inside the pixel circuit 11 increases. Accordingly, in case that the first scan signal GW_P for turning off the second transistor T2 is provided to the second transistor T2, a leakage current passing through the second transistor T2 may be generated. For example, the data voltage DATA (e.g., a black data voltage corresponding to a black image) provided to the second transistor T2 during the non-emission period in which the second transistor T2 is turned off may be provided to the first terminal (for example, the second region 220) of the first transistor T1. Accordingly, the parasitic capacitor CSE may be generated between the fifth gate electrode 410 overlapping the second region 220 and the second region 220. Since the parasitic capacitor CSE is generated, the voltage level of the capacitance generated between the first gate electrode 310 and the fifth gate electrode 410 overlapping the first gate electrode 310 (or the voltage level of the capacitance stored in the storage capacitor CST) may become unstable. Therefore, the voltage level of the first gate electrode 310 may be varied and the first transistor T1 may not stably generate the driving current, so that undesired horizontal lines may be displayed on a conventional organic light emitting display device.

The metal pattern 350 of the organic light emitting display device 1000 according to embodiments of the invention may be disposed between the first active pattern 200 and the fifth gate electrode 410 so that the metal pattern 350 shields the second region 220. Accordingly, the metal pattern 350 may suppress generation of the parasitic capacitor CSE. In other words, the metal pattern 350 may prevent the data voltage DATA provided to the second region 220 from being provided to the fifth gate electrode 410. Thus, the parasitic capacitor CSE may not be generated so that the voltage level of the first gate electrode 310 is maintained. Therefore, the first transistor T1 may stably generate the driving current. Accordingly, undesired horizontal lines may not be displayed on the organic light emitting display device 1000.

The organic light emitting display device 1000 may not be required to maintain a high voltage of the first scan signal GW_P applied at a high voltage level to suppress generation of leakage current of the second transistor T2. Accordingly, a power consumption of the organic light emitting display device 1000 may be reduced, and a voltage margin of the first scan signal GW_P may be secured.

The initialization voltage line 430 and the fifth gate electrode 410 may be disposed on a same layer. The initialization voltage line 430 may provide the initialization voltage VINT to the pixel circuit 11.

Referring to FIGS. 1, 2, 7, 8, and 10, the first interlayer insulating layer 170 may be disposed on the second gate insulating layer 150 and may cover the fifth gate electrode 410. The first interlayer insulating layer 170 may include an insulating material.

The second active pattern 500 may be disposed on the first interlayer insulating layer 170. The second active pattern 500 may include a first region 510, a second region 520, and a third region 530.

In an embodiment, the second active pattern 500 and the first active pattern 200 may be formed on difference layers and may not overlap each other. Accordingly, the second active pattern 500 may be formed separately from the first active pattern 200. For example, the first active pattern 200 may include the silicon semiconductor and the second active pattern 500 may include an oxide semiconductor. For example, the pixel structure 10 may include the first, second, fifth, sixth and seventh transistors T1, T2, T5, T6, and T7, which are silicon-based semiconductor elements, and third and fourth transistors T3 and T5, which are oxide-based semiconductor elements.

The second interlayer insulating layer 190 may be disposed on the first interlayer insulating layer 170 and may cover the second active pattern 500. The second interlayer insulating layer 190 may include an insulating material.

The sixth gate electrode 630 may be disposed on the second interlayer insulating layer 190, may overlap a portion of the second active pattern 500, and may form (or constitute) the third transistor T3 together with the first region 510 and the second region 520. The seventh gate electrode 610 and the sixth gate electrode 630 may be disposed on a same layer. The seventh gate electrode 610 may overlap a portion of the second active pattern 500 and may form (or constitute) the fourth transistor T4 together with the second region 520 and the third region 530.

As described above, since the second active pattern 500 is formed separately from the first active pattern 200, the third and fourth transistors T3 and T4 may be different types of transistors from those of the first, second, fifth, sixth and seventh transistors T1, T2, T5, T6, and T7. For example, the third and fourth transistors T3 and T4 may be NMOS transistors, and the first, second, fifth, sixth and seventh transistors T1, T2, T5, T6, and T7 may be PMOS transistors.

In an embodiment, the metal pattern 350 may overlap a portion of the seventh gate electrode 630 and may not overlap the second active pattern 500 and the eighth gate electrode 610.

A contact hole exposing the sixth region 260 of the first active pattern 200 may be formed in the sixth region 260 of the first active pattern 200 forming the sixth transistor T6. An electrode (for example, a drain electrode) may be formed through the contact hole, and the second terminal of the sixth transistor T6 may be connected to the first terminal of the organic light emitting diode OLED passing through the electrode.

Figure 11:
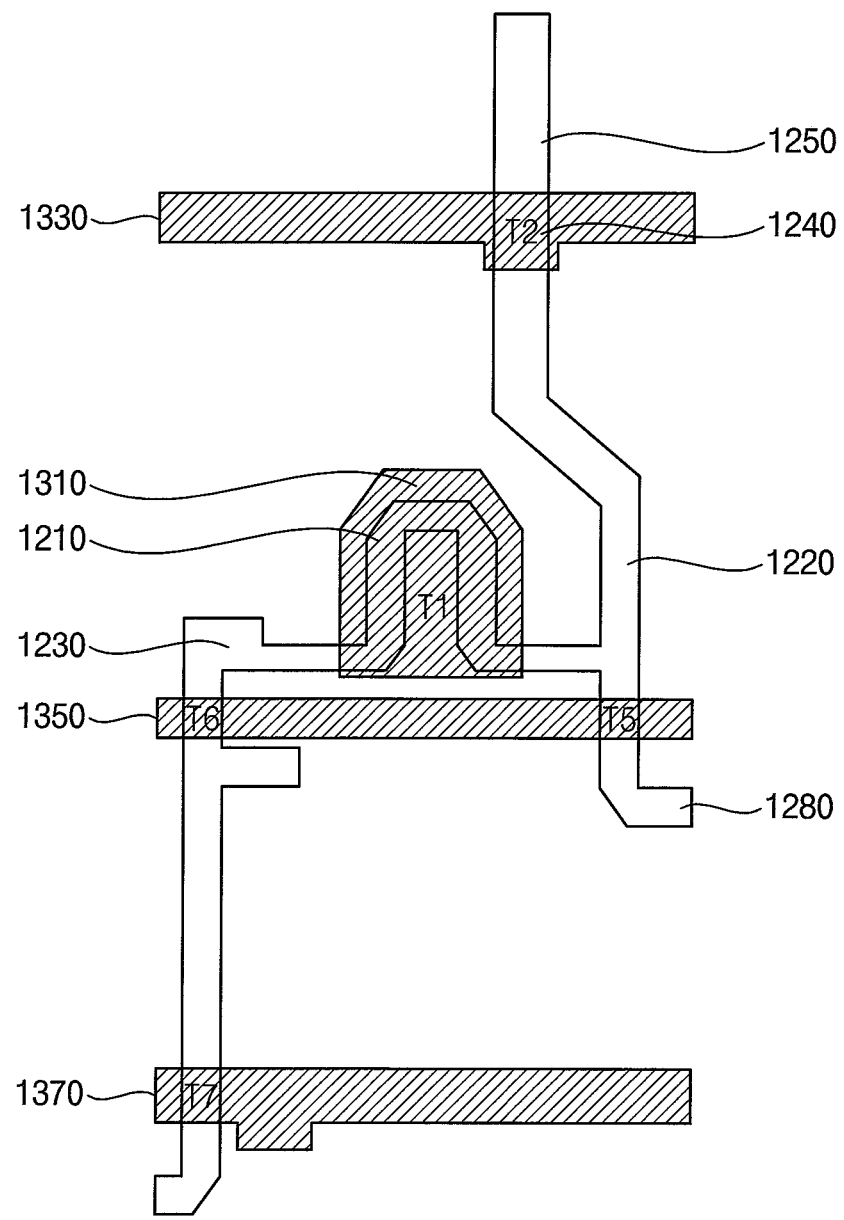
FIGS. 11 to 13 are plan views illustrating an organic light emitting display device according to another embodiment.
Figure 12:
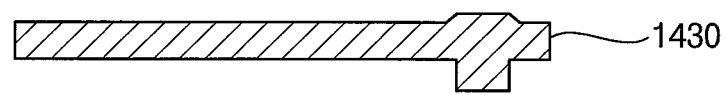
Figure 12:
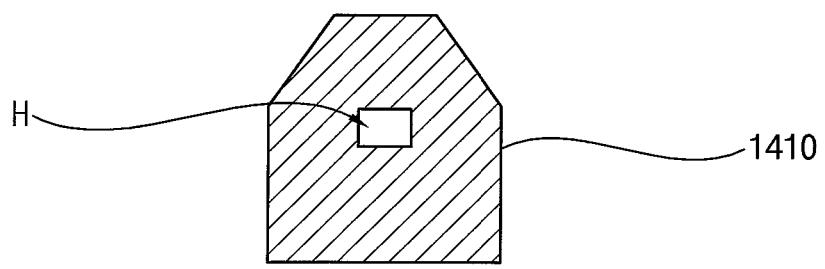
Figure 12:
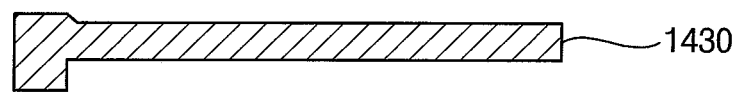
Figure 12:
Figure 13:
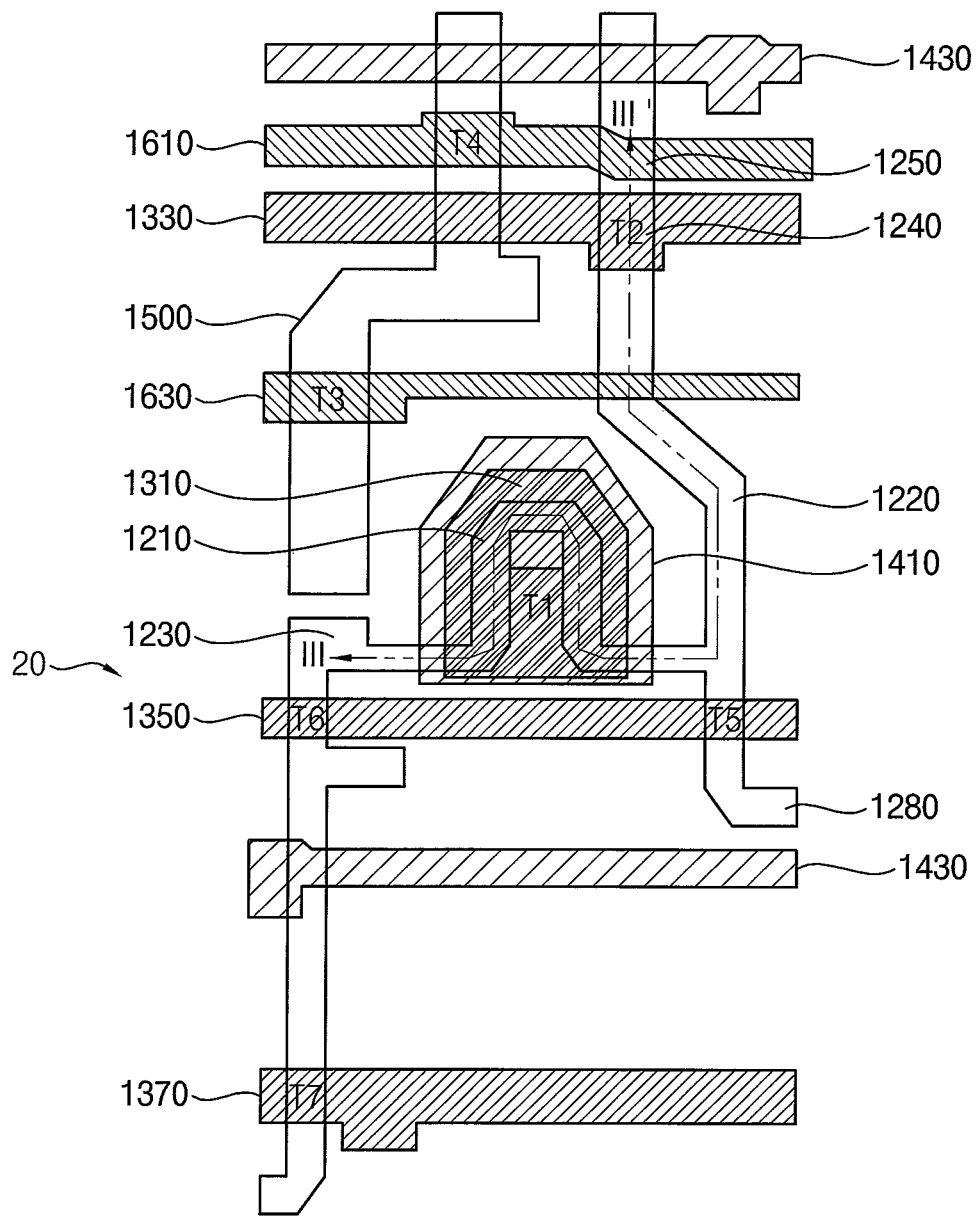
Figure 14:
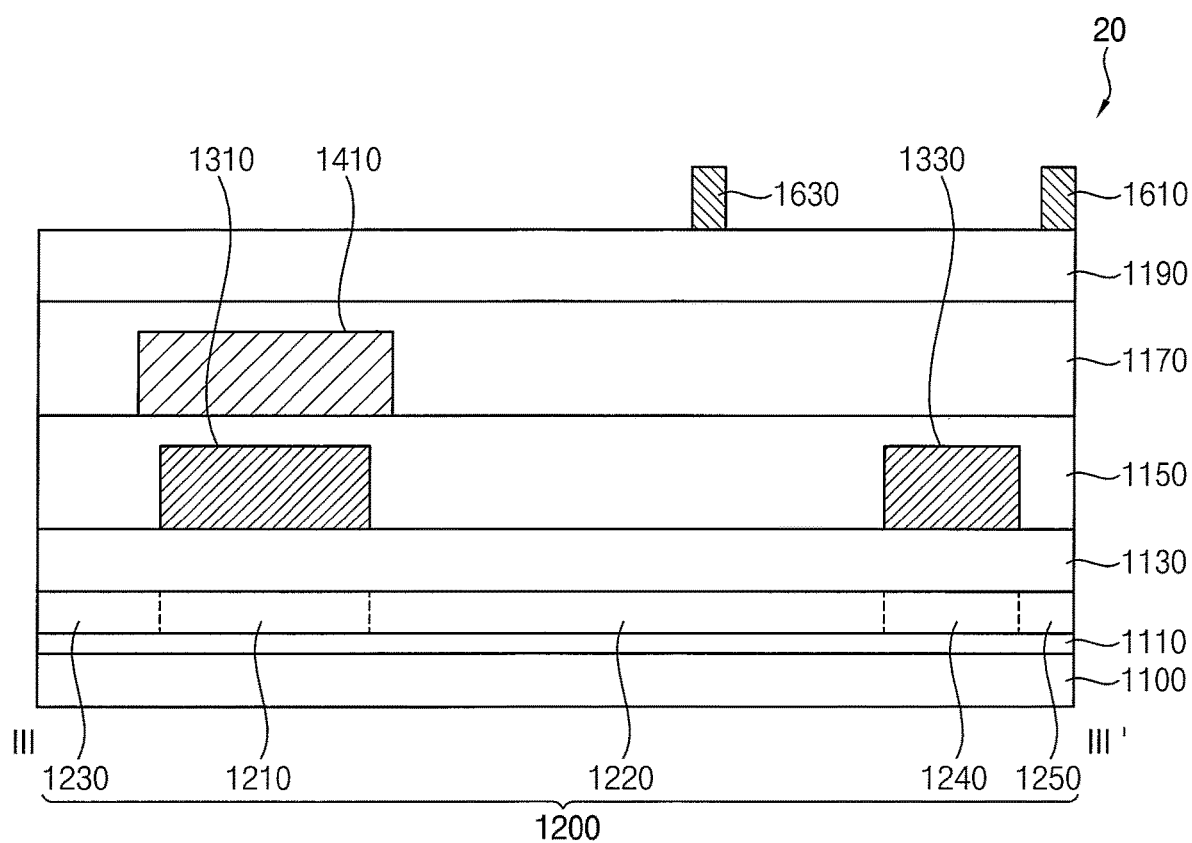
FIG. 14 is a schematic cross-sectional view taken along line III-III' of FIG. 13.

FIGS. 11 to 13 are plan views illustrating an organic light emitting display device according to another embodiment, and FIG. 14 is a schematic cross-sectional view taken along line III-III' of FIG. 13.

Referring to FIGS. 2 and 11 to 14, a pixel structure 20 may include a substrate 1100, a buffer layer 1110, a first active pattern 1200, a first gate insulating layer 1130, a first gate electrode 1310, a second gate electrode 1330, a third gate electrode 1350, a fourth gate electrode 1370, a second gate insulating layer 1150, a fifth gate electrode 1410, a first interlayer insulating layer 1170, a second active pattern 1500, a second interlayer insulating layer 1190, a sixth gate electrode 1630, a seventh gate electrode 1610, and an organic light emitting diode. The pixel structure 20 may include an initialization voltage line(s) 1430. The first active pattern 1200 may include a first region 1210, a second region 1220, a third region 1230, a fourth region 1240, a fifth region 1250, and a sixth region 1280. The pixel structure 20 may not include a metal pattern (for example, the metal pattern 350 of FIG. 8) and may have a different shape of the fifth gate electrode 1410 as compared with the pixel structure 10 described with reference to FIGS. 8 to 10. Except for these differences, the pixel structure 20 is substantially same as the pixel structure 10 described with reference to FIGS. 8 to 10. The abovementioned differences are discussed below.

The first gate electrode 1310 may be disposed on the first gate insulating layer 1130 and may form (or constitute) the first transistor T1 together with a second region 1220 and a third region 1230. For example, the first gate electrode 1310 may overlap a first region 1210 and may not overlap the second region 1220 and the third region 1230.

The fifth gate electrode 1410 may be disposed on the second gate insulating layer 1150 and may form (or constitute) the storage capacitor CST together with the first gate electrode 1310. For example, the fifth gate electrode 1410 may include a hole H overlapping the first gate electrode 1310.

The fifth gate electrode 1410 may not overlap the second region 1220 of the first active pattern 1200. Accordingly, in case that leakage current of the second transistor T2 is generated, the parasitic capacitor described above may not be generated between the fifth gate electrode 1410 and the second region 1220. Therefore, the voltage level of the first gate electrode 1310 is maintained, and the first transistor T1 may stably generate the driving current. Accordingly, undesired horizontal lines may not be displayed on the organic light emitting display device according to another embodiment.

The organic light emitting display device may not be required to maintain the high voltage of the first scan signal GW_P applied at the high voltage level to suppress generation of leakage current of the second transistor T2. Accordingly, the power consumption of the organic light emitting display device may be reduced, and the voltage margin of the first scan signal GW_P may be secured.

The inventive concept may be applied to an organic light emitting display device and an electronic device using the organic light emitting display device. For example, the inventive concept may be applied to a cellular phone, a smart phone, a video phone, a smart pad, a smart watch, a tablet PC, a car navigation system, a television, a computer monitor, a laptop, etc.

The foregoing is illustrative of example embodiments and is not to be construed as limiting thereof. Although a few example embodiments have been described, those of ordinary skill in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display device, comprising:
    a first active pattern disposed on a substrate and including a first region, a second region, and a third region;
    a first gate electrode disposed on the first active pattern, overlapping a portion of the first active pattern, and forming a first transistor together with the first region and the second region;
    a second gate electrode disposed on the first active pattern and forming a second transistor together with the second region and the third region, wherein the first and second gate electrodes are disposed on a same layer;
    a third gate electrode disposed on the first gate electrode, overlapping the second region, and forming a storage capacitor together with the first gate electrode;
    a metal pattern disposed between the first active pattern and the third gate electrode and overlapping the second region; and
    an organic light emitting diode electrically connected to the first transistor, the second transistor, and the storage capacitor.

2. The organic light emitting display device of claim 1, wherein the metal pattern shields the second region so that no parasitic capacitor is generated between the second region and the third gate electrode.

3. The organic light emitting display device of claim 2, wherein
    the first transistor includes a driving transistor, and
    a data voltage is provided to the second region.

4. The organic light emitting display device of claim 1, wherein the metal pattern is disposed along a planar shape of the second region.

5. The organic light emitting display device of claim 1, wherein the metal pattern is spaced apart from the first and second gate electrodes.

6. The organic light emitting display device of claim 1, wherein no voltage is provided to the metal pattern.

7. The organic light emitting display device of claim 1, wherein the metal pattern and the first and second gate electrodes are disposed on the same layer.

8. The organic light emitting display device of claim 1, wherein
    the first, second, and third regions do not overlap the first and second gate electrodes,
    the second region is disposed between the first region and the third region,
    a data voltage is provided to the second region through the second transistor, and
    the data voltage provided to the second region is provided to the first transistor.

9. The organic light emitting display device of claim 1, wherein the first and second transistors are PMOS transistors.

10. The organic light emitting display device of claim 1, wherein the first active pattern includes a silicon semiconductor.

11. The organic light emitting display device of claim 10, wherein ions are injected into the first, second, and third regions.

12. The organic light emitting display device of claim 1, further comprises:
    a first gate insulating layer disposed on the substrate and covering the first active pattern;
    a second gate insulating layer disposed on the first gate insulating layer and covering the first and second gate electrodes; and
    a first interlayer insulating layer disposed on the second gate insulating layer and covering the third gate electrode.

13. The organic light emitting display device of claim 12, further comprises:
    a second active pattern disposed on the first interlayer insulating layer and including a fourth region, a fifth region, and a sixth region;
    a second interlayer insulating layer disposed on the first interlayer insulating layer and covering the second active pattern;
    a fourth gate electrode disposed on the second interlayer insulating layer, overlapping a portion of the second active pattern, and forming a third transistor together with the fourth region and the fifth region; and
    a fifth gate electrode disposed on the second interlayer insulating layer, overlapping a portion of the second active pattern, and forming a fourth transistor together with the fifth region and the sixth region.

14. The organic light emitting display device of claim 13, wherein the metal pattern overlaps a portion of the fourth gate electrode.

15. The organic light emitting display device of claim 13, wherein the metal pattern does not overlap the second active pattern and the fifth gate electrode.

16. The organic light emitting display device of claim 13, wherein the second active pattern does not overlap the first active pattern.

17. The organic light emitting display device of claim 13, wherein
the first active pattern includes a silicon semiconductor, and
the second active pattern includes an oxide semiconductor.

18. The organic light emitting display device of claim 13, wherein
the first and second transistors are PMOS transistors, and
the third and fourth transistors are NMOS transistors.

19. The organic light emitting display device of claim 13, wherein the first active pattern further includes a seventh region, an eighth region, and a ninth region, and the organic light emitting display device further comprises:
a sixth gate electrode disposed on the first active pattern, overlapping a portion of the first active pattern, and forming a fifth transistor together with the second region and the seventh region;
a seventh gate electrode disposed on the first active pattern, overlapping a portion of the first active pattern, and forming a sixth transistor together with the first region and the eighth region; and
an eighth gate electrode disposed on the first active pattern, overlapping a portion of the first active pattern, and forming a seventh transistor together with the eighth region and the ninth region,
wherein the first, second, sixth, seventh, eighth gate electrodes are disposed on the same layer.

20. The organic light emitting display device of claim 19, wherein the sixth gate electrode and the seventh gate electrode are electrically connected to each other.

* * * * *